(12) United States Patent
Welp et al.

(10) Patent No.: US 11,025,257 B2
(45) Date of Patent: Jun. 1, 2021

(54) DEVICES AND METHODS FOR GENERATING A BROADBAND FREQUENCY SIGNAL

(71) Applicant: Fraunhofer-Gesellschaft zur Förderung der angewandten Forschung e.V., Munich (DE)

(72) Inventors: Benedikt Welp, Essen (DE); Nils Pohl, Bochum (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/744,232

(22) Filed: Jan. 16, 2020

(65) Prior Publication Data
US 2020/0235745 A1   Jul. 23, 2020

(30) Foreign Application Priority Data
Jan. 18, 2019   (DE) .......................... 102019101261.9

(51) Int. Cl.
*H03L 7/099*  (2006.01)
*H03B 5/12*  (2006.01)
(Continued)

(52) U.S. Cl.
CPC ........... *H03L 7/099* (2013.01); *H03B 5/1215* (2013.01); *H03C 3/0925* (2013.01); *H03C 3/0941* (2013.01); *H03L 7/18* (2013.01); *H04B 1/713* (2013.01); *H04L 7/0331* (2013.01); *H04L 27/10* (2013.01)

(58) Field of Classification Search
None
See application file for complete search history.

(56) References Cited

U.S. PATENT DOCUMENTS

2005/0237117 A1* 10/2005 Vu .......................... H03L 7/093
331/2
2009/0066436 A1* 3/2009 Wang ..................... H04B 1/006
332/119

(Continued)

OTHER PUBLICATIONS

Wolaver, D.H., Phase-Locked Loop Circuit Design, Prentice Hall, Englewood Cliffs, NJ, pp. 81-82 (1991).

*Primary Examiner* — Cassandra F Cox
(74) *Attorney, Agent, or Firm* — 2SPL Patent Attorneys PartG mbB; Kieran O'Leary

(57) ABSTRACT

An example of a device for generating a broadband frequency signal comprises a first controlled oscillator, a second controlled oscillator, a phase-locked loop for feeding back an output signal of a controlled oscillator to the corresponding controlled oscillator, and a mixer. The mixer is configured to generate the broadband frequency signal by mixing an output signal of the first controlled oscillator and an output signal of the second controlled oscillator. The device may, for example, be realized by means of a single phase-locked loop. A further example relates to a device for generating a frequency signal with a controlled oscillator and a phase-locked loop with a further controlled oscillator and a mixer in the feedback path of the phase-locked loop. Examples further relate to a high-frequency device for emitting a high-frequency signal and a method for generating a broadband frequency signal.

19 Claims, 5 Drawing Sheets

(51) Int. Cl.
  *H03C 3/09* (2006.01)
  *H03L 7/18* (2006.01)
  *H04B 1/713* (2011.01)
  *H04L 7/033* (2006.01)
  *H04L 27/10* (2006.01)

(56) References Cited

U.S. PATENT DOCUMENTS

| | | | |
|---|---|---|---|
| 2014/0031076 A1* | 1/2014 | Tang | G01R 31/2832 |
| | | | 455/550.1 |
| 2015/0295582 A1 | 10/2015 | El Moznine et al. | |
| 2017/0201262 A1* | 7/2017 | Bisanti | H03L 7/185 |
| 2017/0302282 A1* | 10/2017 | Josefsberg | H03L 7/091 |

* cited by examiner

DEVICES AND METHODS FOR GENERATING A BROADBAND FREQUENCY SIGNAL

CROSS-REFERENCE TO RELATED APPLICATION

This application claims priority to German Application 10 2019 101 261.9, filed on Jan. 18, 2019. The contents of the earlier filed application is incorporated by reference herein in its entirety.

TECHNICAL FIELD

Embodiments relate to devices for generating broadband frequency signals and to methods for generating broadband frequency signals. Further embodiments relate to a high-frequency device for generating high-frequency signals. Examples relate to devices including a phase-locked loop for stabilizing oscillators and for generating broadband-stabilized frequency signals.

BACKGROUND

Oscillators (e.g. voltage-controlled oscillators; VCO) may be used to generate broadband signals (e.g. frequency ramps). A frequency of an output signal of a voltage-controlled oscillator may be set and stabilized using a phase-locked loop (PLL). A frequency-wise highly stable crystal oscillator, for example, is be used as a reference signaling device, which is low-frequent (e.g. compared to a frequency of the output signal of the VCO, e.g. with a frequency of 100 Mhz or less) and which can operate at a fixed frequency.

An output signal of the VCO may be divided by a static frequency divider and an adjustable divider in a feedback path of the PLL and may be compared with a divided reference signal of the crystal oscillator by means of a PFD (phase-frequency discriminator). The phase difference output by the PFD serves as the regulated variable and is converted into a regulated voltage, which sets the output frequency of the oscillator (VCO) such that the phase difference of the two input frequencies at the PFD is zero, via a charge pump (CP) and a loop filter.

In modern applications broadband signals may be required, the generation of which is difficult and complex. Known oscillators, for example, provide only a limited bandwidth. The relative bandwidth of these oscillators is typically less than 20%.

Further, the generation of a broadband signal results in very different divider values of frequency dividers having to be used in the feedback path of the phase-locked loop. This can lead to high fluctuations in the gain of the PLL due to a gain of the PLL, which depends on the value range of the divider values. For example, phase-locked loops PLLs having high variation of a loop gain of the PLLs are known with very broadband signals. It may be necessary to reduce the variation in order to generate the broadband signal more reliably. A high variation in loop gain can limit the frequency range in which the PLL is capable of stabilizing the oscillator.

There may be a desire for improved concepts that enable a generation of signals with increased bandwidth.

SUMMARY

Concepts are provided to meet this desire. Accordingly, one aspect of the present disclosure concerns a device for generating a broadband frequency signal, for example a signal $f_{out}$. The proposed device comprises a first controlled oscillator and a second controlled oscillator. The device further comprises at least one phase-locked loop (PLL) for feeding back a signal to at least one of the controlled oscillators. The signal is based on at least one output signal of one of the controlled oscillators. For example, the signal corresponds to the output signal of one of the controlled oscillators. The device further comprises a mixer configured to generate the broadband frequency signal (e.g. an output signal of the device) by mixing the output signal of the first controlled oscillator and the output signal of the second controlled oscillator.

For example, the device includes two separate phase-locked loops, wherein each one is assigned to one controlled oscillator. Hereby, an output signal of the first controlled oscillator in a first one of the two phase-locked loops may be fed back to an input of the first controlled oscillator and an output signal of the second controlled oscillator in a second one of the two phase-locked loops may be fed back to an input of the second controlled oscillator. For example, the first controlled oscillator is configured to output an output signal of a first bandwidth within a first frequency range and the second controlled oscillator is configured to output an output signal of a second bandwidth within a second frequency range, which differs from the first frequency range. The broadband frequency signal may be generated with a bandwidth greater than the first or second bandwidth by the mixing process. For example, a bandwidth of the broadband frequency signal may be realized up to the sum of the first and second bandwidth.

In order to increase the bandwidth of the generated signal, two very high frequency controlled oscillators may be provided, each of which have a high absolute bandwidth. The controlled oscillators may include voltage-controlled oscillators (VCO) or digitally controlled oscillators. For example, the controlled oscillators comprise two adjacent frequency ranges so that the mixer may output signals with the combined bandwidth of both controlled oscillators.

For example, stabilized output signals with reduced phase noise close to the carrier may be generated using two controlled oscillators. For example, tune voltages (e.g. control voltage applied to the input of the oscillator during oscillator operation) evolving in opposite directions or differential tune voltages for generating broadband output signals may be provided for both controlled oscillators. Interference couplings, which, e.g., couple to these two tune voltages in common mode, may be compensated or eliminated by the mixing process (difference frequency), for example, provided that the tuning slopes of the oscillators are the same or sufficiently similar.

For example, the device includes a reference signal source (e.g., crystal oscillator) associated with the first and second controlled oscillators together. Accordingly, a reference signal from the common reference signal source may, for example, be used both for a phase-frequency discriminator of the first phase-locked loop and for a phase-frequency discriminator of the second phase-locked loop (for example, using different adjustable dividers or frequency dividers).

According to an example of the device, a phase-locked loop, which is associated with the first and the second controlled oscillators together, is intended. In other words, a single phase-locked loop may be used for both oscillators. The previously mentioned common reference signal may be coupled to the phase-frequency discriminator or phase-frequency discriminator of the common phase-locked loop. Further, the broadband frequency signal, e.g. the output signal of the mixer, may be routed to the phase-frequency discriminator in a feedback path of the common phase-locked loop. For example, correspondingly, the output of the mixer is coupled to the phase-locked loop to enable feedback of the broadband frequency signal via the common phase-locked loop. The common phase-locked loop may be configured, for example, to generate a signal (e.g. voltage signal) by means of the phase-frequency discriminator or in the signal path behind the phase-frequency discriminator. The device may be configured to generate a control signal or input signal based on this signal for both the first controlled oscillator and the second controlled oscillator.

The term coupled may, for example, denote a direct connection between elements, or alternatively denote a connection of elements with, for example, further signal processing units such as filters, etc. in a path between the elements.

By means of the one common phase-locked loop, two oscillators may thus be efficiently controlled or operated and/or stabilized. Through the proposed device, a switching complexity of the device for generating broadband signals using two high-frequency oscillators may be reduced. Further, for example compared to a device with two phase-locked loops, a better (e.g. lower) in-loop phase noise may be achieved, as the broadband frequency signal (e.g. the output signal of the device) serves as the signal to which control is applied (e.g. in contrast to the direct use of the output signals of the controlled oscillators). In addition, with this, overall smaller division factors may be selected in the feedback path of the phase-locked loop.

Further, by using a common phase-locked loop, the need to synchronize two phase-locked loops may be avoided. For example, broadband signals (e.g., frequency ramps) with increased linearity may be generated by means of the output signal (for example, the signal behind the mixer) (as required with e.g. FMCW radar systems), while avoiding high circuit complexity, high power loss due to the two phase-locked loops, and/or higher in-loop phase noise (since, e.g., the phase noise of two phase-locked loops adds up through the mixing process).

In order to be able to generate the broadband frequency signal, a frequency change of the output signals of the two controlled oscillators in the opposite direction may be necessary. In order to stabilize two oscillators, which cause frequency changes of their output signals (in order to be able to generate broadband output signals) in the opposite direction, by means of a single phase-locked loop, different concepts are provided.

For example, the first and second controlled oscillators are configured to cause a frequency change in the same direction upon change of an input voltage; in other words, they may comprise a same transmission behavior, at least qualitatively. For example, with a same transmission behavior of the oscillators, a low input voltage may each cause a low output frequency and a high input voltage may each cause a high output frequency. In this case, it may be intended that a signal processing unit inverting a control signal of the oscillator is arranged at the input of one of the two controlled oscillators. For example, an additional filter (inverting filter, e.g. subtraction amplifier) is arranged between a (e.g. common) loop filter of the phase-locked loop and the input of the one controlled oscillator, wherein the filter e.g. inverts and/or converts the tune voltage signal in such a way (e.g. by adding an offset voltage), that the tuning characteristics of both oscillators may be completely passed in the opposite direction by the regulated voltages generated, for example in order to achieve a maximization of the possible bandwidth of the output signal (e.g. the signal $f_{out}$). In other words, for example, the control signal for the second oscillator may be generated based on the control signal of the first oscillator.

Alternatively, it may be intended that the first and second controlled oscillators are configured to cause a frequency change in the opposite direction upon a change of an input voltage. With such opposite transmission behavior by the oscillators, the inversion of the one signal may, correspondingly, be forgone, so that the additional filter may be avoided, for example, and a switching complexity may be further reduced.

Due to the joint generation of the tune voltages for both controlled oscillators, a slightly reduced interference suppression of the tune voltages, for example, may result. Especially conventional PLL methods, in which an oscillator is stabilized using a phase-locked loop via a single-ended tune voltage, suffer from the high interference susceptibility of the tune voltage to interference signal coupling. Therefore, concepts for improving interference suppression are proposed.

For example, the common phase-locked loop of the device includes a separate loop filter for each controlled oscillator. In other words, the phase-locked loop is configured to generate an individual control signal for each of the two controlled oscillators. For example, in contrast to other concepts, the second tune voltage for the second oscillator is not derived from the first tune voltage, but both tune voltages may be generated from a same signal of the phase-locked loop, e.g. from an output voltage of a charge pump (CP) of the phase-locked loop.

For example, both controlled oscillators comprise a similar tuning slope and the lines from the charge pump to the individual separate loop filters may be configured in a very short manner in order to reduce interference coupling. For example, the tuning slope of one controlled oscillator differs from the tuning slope of the other controlled oscillator by less than 10% (or less than 5% or less than 3%). The tune voltages behind the loop filters may be referred to as differential tune voltage pair, where interference couplings may be reduced or eliminated by the mixing process of the two controlled oscillators.

In accordance with an example for reducing the influence of interference couplings, the common phase-locked loop comprises a differential charge pump, wherein a positive output of the differential charge pump is coupled to the first controlled oscillator and a negative output of the differential charge pump is coupled to the second controlled oscillator. In other words, a modification of the charge pump, where the same is divided into two parts working in the opposite direction, may cause differential output voltages of the charge pump to be created. These may be adapted to the operating ranges of the controlled oscillators by respective loop filters. Common mode interference couplings may in turn thus be reduced or eliminated by the differential mixing process of the two controlled oscillators (provided that tuning slopes are similar). As an alternative to a differential charge pump, it may be possible to use an amplifier or a signal processing unit of another kind with differential outputs. For example, an inverting signal processing unit may also be arranged between an output of a non-differential charge pump and one of the two loop filters.

It may be intended that the phase-locked loop further includes an additional controlled oscillator and an additional mixer in the feedback path of the phase-locked loop. Thus, a frequency of a feedback signal of the phase-locked loop (e.g. based on the broadband frequency signal) may be increased by means of the additional controlled oscillator and the additional mixer.

Mixing to a higher frequency causes a relative reduction of the distance between the minimum and maximum signal frequency of the fed back signal in the signal path behind the additional controlled oscillator. For example, an adjustable frequency divider is arranged between the additional mixer and the phase-frequency discriminator. Due to the lower relative frequency range of the signals received at the adjustable frequency divider, a required ratio of the maximum divider value and minimum divider value of the adjustable frequency divider for dividing the frequency of the feedback signal may be reduced. Since a fluctuation or variation of a loop gain of the phase-locked loop may depend on the adjustable frequency divider, it is possible to reduce a variation of the loop gain of the phase-locked loop due to the reduced ratio of the divider values.

For example, an upper cut-off frequency of the first controlled oscillator is greater than or equal to a lower cut-off frequency of the second controlled oscillator. In other words, the frequency ranges of the two controlled oscillators may overlap. Thus, for example, a broadband frequency signal with frequencies from 0 Hz (when the output signals of the controlled oscillators have the same frequency) to a frequency corresponding to a frequency difference between a lower cut-off frequency of the first oscillator and an upper cut-off frequency of the second oscillator (at a maximum output frequency of the one controlled oscillator and a minimum output frequency of the other oscillator) may be generated.

Alternatively, the upper cut-off frequency of the first oscillator may be lower than the lower cut-off frequency of the second oscillator. The distance between those two frequencies may be equal to the lower cut-off frequency of the output signal.

For example, a bandwidth of the generated broadband frequency signal corresponds to the sum of the respective bandwidths of the output signals of the first controlled oscillator and the second controlled oscillator. For example, both controlled oscillators may generate respective output signals having a bandwidth of 20 GHz, so that the broadband frequency signal may have a bandwidth of 40 GHz.

For example, the broadband frequency signal, which can be generated, comprises a bandwidth of at least 5 GHz (or of at least 10 GHz, of at least 15 GHz, of at least 20 GHz, of at least 25 GHz, of at least 30 GHz, of at least 35 GHz, of at least 40 GHz, or of at least 50 GHz). For example, the broadband frequency signal, which can be generated, comprises a relative bandwidth of more than 10% (or more than 15%, more than 20%, more than 25% or more than 30%). The proposed device may enable the generation of very broadband signals using only one phase-locked loop with reduced switching complexity. A maximum relative bandwidth for generated signals with a minimum frequency of 0 Hz may be e.g. 200% with this method.

For example, a lower cut-off frequency of the output signals of the controlled oscillators is bigger than 100 MHz (or bigger than 500 MHz, bigger than 1 GHz, bigger than 5 GHz, bigger than 10 GHz, bigger than 20 GHz, bigger than 60 GHz, bigger than 80 GHz, bigger than 100 GHz, bigger than 150 GHz, or bigger than 200 GHz) and/or smaller than 300 GHz (or smaller than 200 GHz, or smaller than 100 GHz).

According to an example, the device is configured to generate a broadband ramp signal, but monofrequency or differently shaped signals are also possible (Frequency Shift Keying/Frequency Hopping). The ramp signal may be a signal with linearly increasing or linearly decreasing signal frequency. For example, the broadband frequency signal is a radar signal, a mobile radio signal and/or a measurement signal.

An example of the present disclosure relates to a device for generating a frequency signal, such as a broadband and/or high frequency frequency signal. The device comprises at least a first controlled oscillator and a phase-locked loop with a further controlled oscillator and a mixer in the feedback path of the phase-locked loop. Thus, a frequency of a feedback signal of the phase-locked loop may be increased by means of the further controlled oscillator and the mixer.

For example, the mixer is located between a static frequency divider and an adjustable frequency divider in the feedback path of the phase-locked loop. A ratio of maximum frequency to minimum frequency of the signal at the input of the adjustable divider may be reduced using the additional mixing operation provided. Thus, a relative value range of required divider values of the adjustable frequency divider may be reduced, for example the ratio of maximum divider value used to minimum divider value may be reduced. Due to the reduced ratio, a required operation range of the adjustable divider may be reduced and thus, for example, a variation of the loop gain may be reduced and/or the use of the phase-locked loop for processing the broadband frequency signal as a feedback signal may be made possible.

For example, the device comprising a mixer comprises a second controlled oscillator and a further mixer in the feedback path of the phase-locked loop, wherein the mixer is configured to generate the frequency signal by mixing an output signal of the first controlled oscillator and an output signal of the second controlled oscillator. The output of the further mixer may be coupled to the phase-locked loop. The frequency signal generated may be fed back into the phase-locked loop as a control signal.

One aspect of the present disclosure concerns a high-frequency device, e.g. a high-frequency device for generating a high-frequency signal with a device previously or subsequently described. For example, the device may be used in various applications in which very broadband signals are generated and in which, for example, power loss, switching complexity and/or interference immunity to interference couplings play a role. For example, examples are high-frequency measurement technology, radar technology and mobile communications. Accordingly, the high-frequency device may be configured to be a measuring device, radar device or mobile radio device (e.g. communication chip).

Further, a method for generating a broadband frequency signal is proposed. The method comprises operating a first controlled oscillator and a second controlled oscillator using a common phase-locked loop. The method further comprises mixing output signals of the two controlled oscillators, in order to generate the broadband frequency signal. For example, a broadband frequency signal with increased bandwidth may be generated in an efficient manner from the output signals of the two controlled oscillators (e.g. broadband oscillators with an absolute bandwidth of 20 GHz), requiring only a single phase-locked loop. This may significantly reduce a switching complexity of a circuit for carrying out the method.

For example, the phase-locked loop used according to the method comprises an adjustable frequency divider (fractional divider) in a feedback path between an output of a mixer and an input of a phase-frequency discriminator. When operating the phase-locked loop, a ratio of a maximum divider value of the adjustable divider to a minimum divider value of the adjustable divider with a value of less than 3 (or less than 2, or less than 1.5) may be used. This may be achieved by mixing a feedback signal in the feedback path of the phase-locked loop to a higher frequency, for example, before processing by means of the adjustable divider, so that a relative difference between a maximum and a minimum frequency of the signal present at the divider may be minimized. Due to the lower ratio of the used divider values, for example, a variation of a loop gain of the phase-locked loop may be reduced.

For example, a frequency ramp with a relative bandwidth of at least 20% may be generated according to the method. Radar signals or mobile radio signals, for example, may be generated or created.

Examples listed in connection with the proposed device may also be used for the high frequency device proposed and/or the process proposed. Therefore, a repetitive description of these examples is omitted. Examples described in connection with the device are also considered to be disclosed in connection with the high frequency device and the proposed method.

BRIEF DESCRIPTION OF THE FIGURES

Some examples of devices and/or methods will be described in the following by way of example only and with reference to the accompanying figures, in which.

DESCRIPTION

Various examples will now be described more fully with reference to the accompanying figures in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, *mutatis mutandis*, for combinations of more than two Elements.

The terminology used herein for the purpose of describing particular examples is not intended to be limiting for further examples. Whenever a singular form such as "a," "an," and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including," when used, specify the presence of the stated features, integers, steps, operations, processes, elements, components and/or any group of the same, but do not preclude the presence or addition of one or more other features, integers, steps, operations, processes, elements, components and/or any group thereof.

Unless otherwise defined, all terms (including technical and scientific terms) are used herein in their ordinary meaning of the art to which the examples belong.

Figure 1:
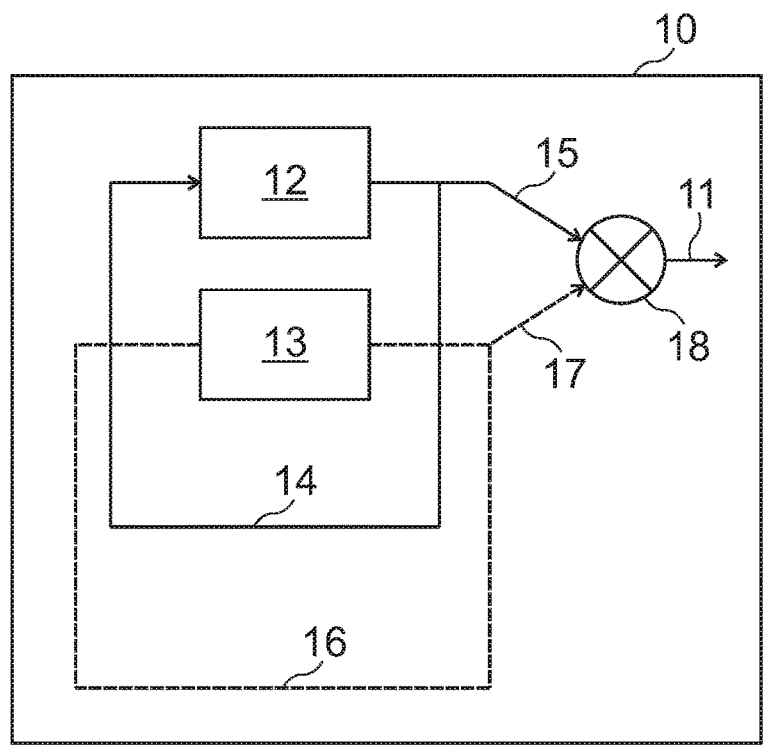
FIG. 1 shows a schematic illustration of a device with two controlled oscillators.

FIG. 1 shows a schematic illustration of a device 10 with two controlled oscillators 12, 13. The device 10 is configured to generate a broadband frequency signal 11 (e.g. an output signal $f_{out}$). A phase-locked loop 14 of the device 10 is configured for feeding back a signal of the device 10, which is based on at least one output signal 15, 17 of one of the controlled oscillators 12, 13 to the corresponding controlled oscillator 12, 13. For example, the output signal 15 of the first controlled oscillator 12 is fed back to the input of the oscillator 12 via the phase-locked loop 14. For example, the device 10 comprises a further phase-locked loop 16, via which the output signal 17 of the second oscillator 13 is fed back. Alternatively, the broadband frequency signal 11 may be routed via the phase-locked loop 14 to both the input of the first oscillator 12 and the input of the second oscillator 13. The phase-locked loop 14 may illustrate a PLL circuit, e.g. including dividers, PFD, CP, reference signal, and/or loop filter etc.).

Further, device 10 comprises a mixer 18, which is configured to generate the broadband frequency signal 11 by mixing the output signal 15 of the first controlled oscillator 12 and the output signal 17 of the second controlled oscillator 13. By mixing the two output signals 15, 17, the broadband frequency signal 11 with increased bandwidth may be generated, for example with a bandwidth corresponding to the sum of the bandwidths of the two output signals 15, 17.

Figures 1A, 2:
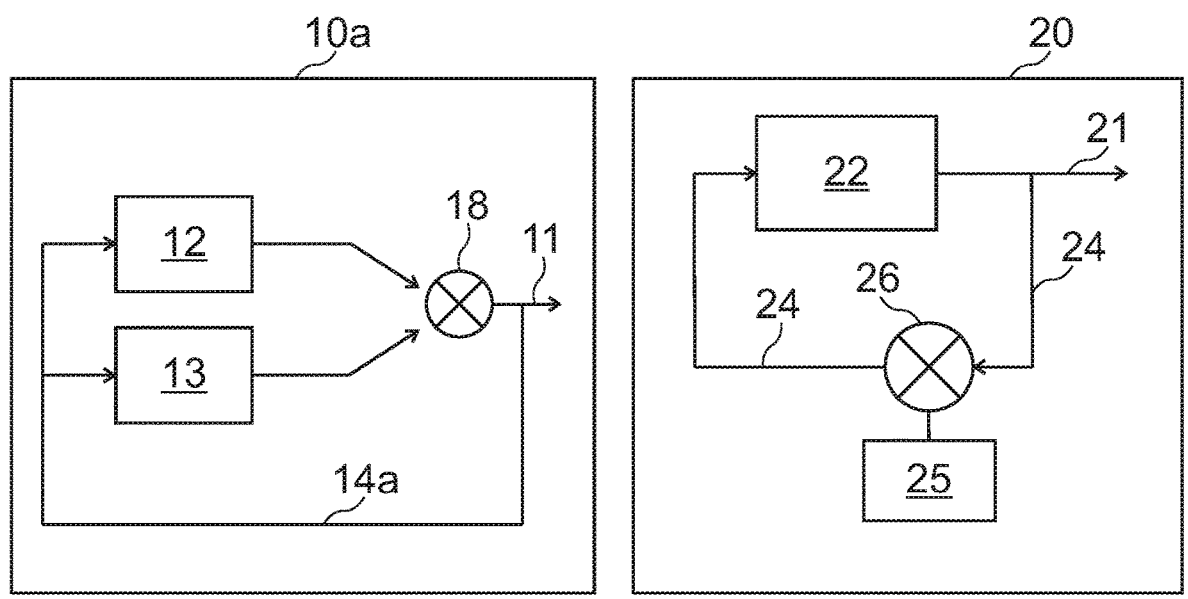
FIG. 1a shows a schematic illustration of a device with two controlled oscillators and a common phase-locked loop.
FIG. 2 shows a schematic illustration of a device with a controlled oscillator in a feedback path of a phase-locked loop.

FIG. 1a shows a schematic illustration of a device 10a, also with two controlled oscillators 12, 13. The device 10a is also configured to generate a broadband frequency signal 11 (e.g. the output signal $f_{out}$). A common phase-locked loop 14a of the device 10a is configured to feed back the broadband frequency signal 11 of the device 10a to both oscillators 12, 13.

FIG. 2 shows a schematic illustration of a device 20 with a controlled oscillator 25 in a feedback path of a phase-locked loop 24 of the device 20. The device 20 is configured to generate a frequency signal 21 and comprises at least a first controlled oscillator 22 as well as a phase-locked loop 24 with the further controlled oscillator 25 and a mixer 26 in the feedback path of the phase-locked loop 24. Thus, a frequency of a feedback signal of the phase-locked loop 24 may be increased by means of the further controlled oscillator 25 and the mixer 26. For example, the fed back signal mixed upward to a higher frequency is passed on to a further frequency divider before a phase-frequency discriminator of the phase-locked loop 24.

Increasing the frequency of the feedback signal enables, for example, a reduction of a relative frequency range of the signal received at the further frequency divider (e.g. with adjustable broken frequency ratio). That way, a ratio between a maximum and a minimum divider value of the further frequency divider may be reduced and thus, e.g., a variation of the loop gain of the phase-locked loop 24 may be reduced.

Further details and aspects are described in connection with examples detailed further above or further below. The examples shown using FIG. 2 may comprise one or more optional additional features corresponding to one or more aspects described in connection with the proposed concept or one or more examples further above or further below (for example in connection with FIGS. 1 and 3-7, particularly in connection with FIG. 8).

Figure 3:
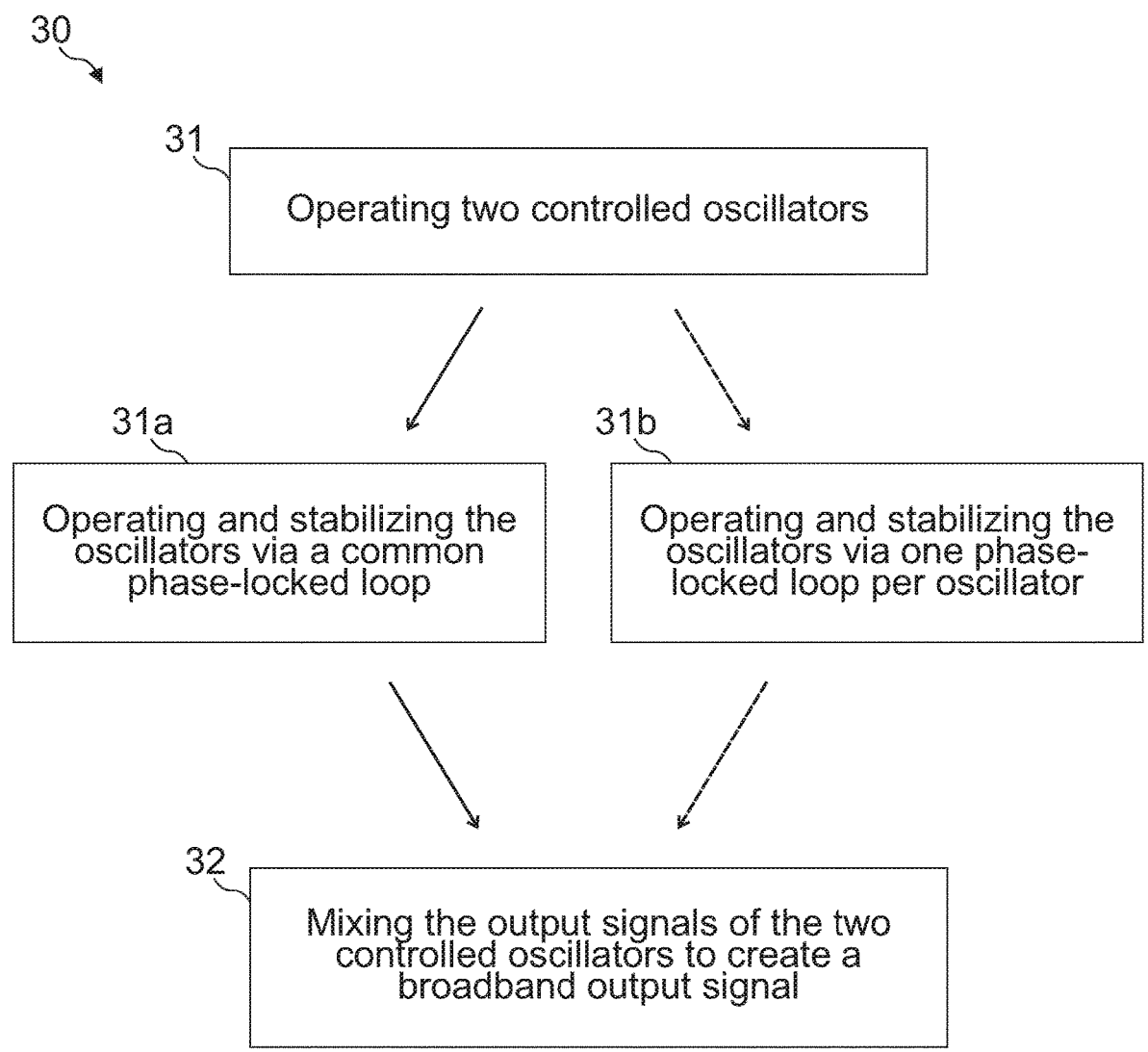
FIG. 3 shows a flowchart of exemplary methods for generating a broadband frequency signal.

FIG. 3 shows a flowchart of a method 30 for generating a broadband frequency signal. Method 30 comprises operating 31 of a first controlled oscillator and a second controlled oscillator using a common phase-locked loop (e.g. operating and stabilizing 31a of the oscillators via a common phase-locked loop) and mixing 32 the output signals of the two controlled oscillators in order to generate the broadband frequency signal.

Alternatively, a method is illustrated, which comprises operating and stabilizing 31b the oscillators via one phase-locked loop per oscillator. In the alternative method a mixing 32 of the output signals of the two controlled oscillators is also done, in order to generate the broadband output signal.

Further details and aspects are described in connection with examples detailed further above or further below. The examples shown using FIG. 3 may comprise one or more optional additional features corresponding to one or more aspects described in connection with the proposed concept or one or more examples further above or further below (for example in connection with FIGS. 1, 2 and 4-8).

Figure 4:
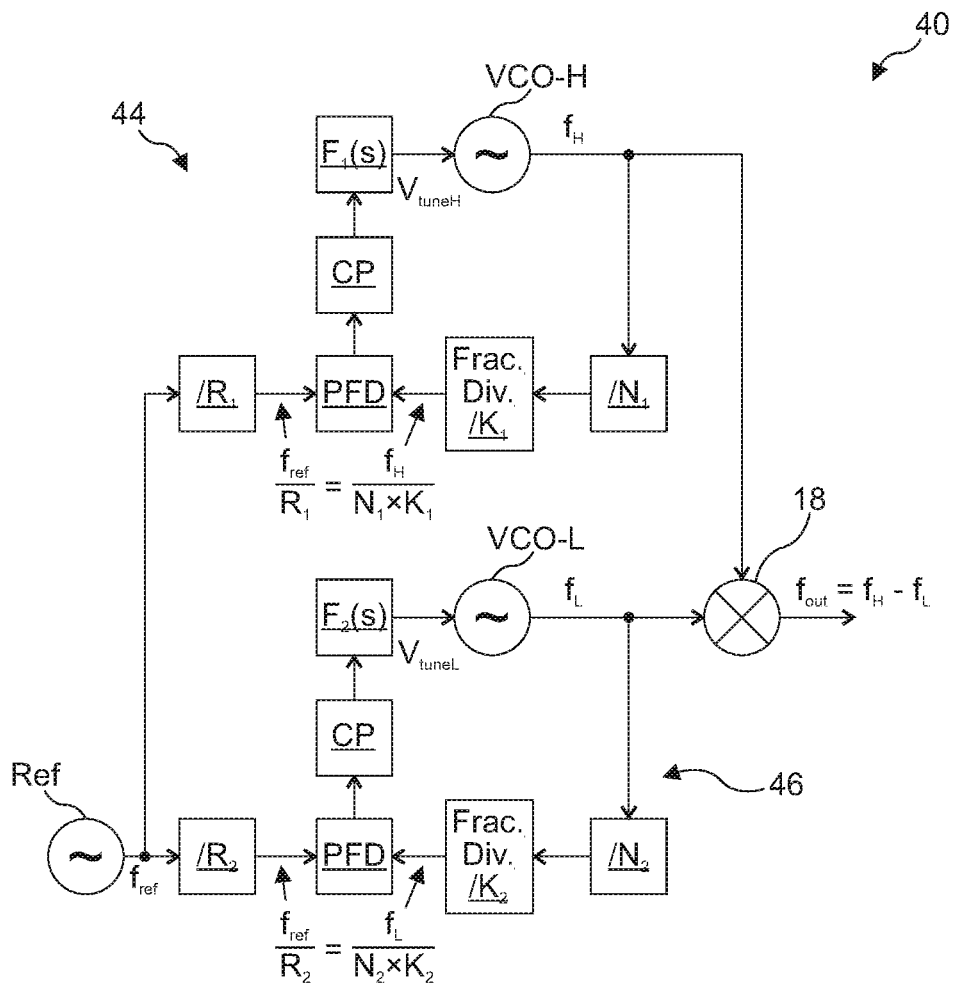
FIG. 4 shows a schematic illustration of a device with two controlled oscillators and respective phase-locked loops associated with the oscillators.

FIG. 4 shows a schematic illustration of a device 40 with two controlled oscillators (here voltage-controlled oscillators, VCO) VCO-H, VCO-L and one phase-locked loop 44, 46 per oscillator VCO-H, VCO-L. For example, a frequency range of the one controlled oscillator VCO-H is higher than that of the other controlled oscillator VCO-L. A mixer 18 is configured to mix output signals $f_H$, $f_L$ of the oscillators VCO-H, VCO-L to an output signal $f_{out}$ of the device 40.

In the respective phase-locked loop 44, 46, a respective output signal $f_H$, $f_L$ of the corresponding oscillators VCO-H, VCO-L is each divided by a first static frequency divider $/N_1$, $/N_2$ (integer divider) and an adjustable divider $/K_1$, $/K_2$ (fractional and/or integer divider) and compared with a reference signal $f_{Ref}$ of a reference signal source Ref, which is divided by respective dividers $/R_1$, $/R_2$ via a separate phase-frequency discriminator PFD each. A phase difference output by the PFD serves as the regulated variable and is converted into a regulated voltage, which sets the output frequency of the respective oscillator VCO-H, VCO-L such that the phase difference of the two input frequencies at the corresponding PFD is zero, by a charge pump (CP) and a loop filter $F_1(s)$, $F_2(s)$ each.

For example, the high-frequency oscillators cover two adjacent frequency ranges (e.g. 80 GHz-100 GHz for VCO-L and 100 GHz-120 GHz for VCO-H) so that output signals having the combined bandwidth of both VCOs (e.g. from 0 Hz-40 GHz) may be generated behind the mixer.

Further details and aspects are described in connection with examples detailed further above or further below. The examples shown using FIG. 4 may comprise one or more optional additional features corresponding to one or more aspects described in connection with the proposed concept or one or more examples further above or further below (for example in connection with FIGS. 1-3 and 5-8).

Figure 5:
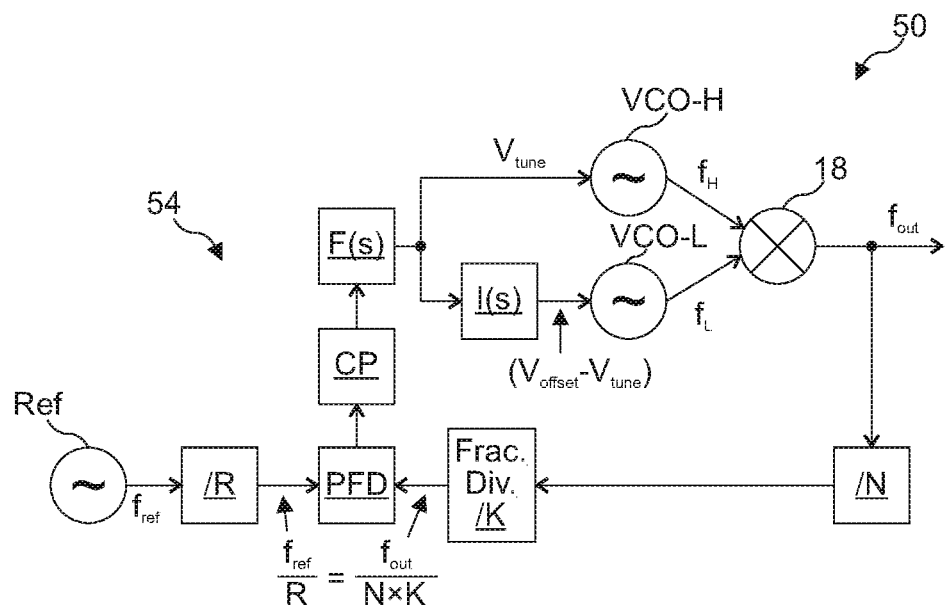
FIG. 5 shows a schematic illustration of a device with two controlled oscillators and a common phase-locked loop.

FIG. 5 shows a schematic illustration of a device 50 with two controlled oscillators VCO-H, VCO-L and a common phase-locked loop 54. The phase-locked loop 54 comprises an integer divider $/N$ and a fractional and/or integer adjustable divider $/K$ via which the output signal $f_{out}$ of device 50 is routed to a common phase-frequency discriminator PFD. A reference signal $f_{Ref}$ of a reference signal source Ref is routed to the phase-frequency discriminator PFD via a divider $/R$. A phase difference output by the PFD serves as a regulated variable and is converted into a regulated voltage $V_{tune}$ via a common charge pump CP and a loop filter F(s).

The regulated voltage $V_{tune}$ is used directly as input signal of the first voltage-controlled oscillator VCO-H. Further, an additional filter I(s) (e.g. inverting, e.g. subtraction amplifier) is intended, which processes and adapts the control signal or the regulated voltage $V_{tune}$ to the operating range of the second voltage-controlled oscillator in such a way that it passes through its entire operating range in the opposite direction to that of the first voltage-controlled oscillator. E.g. an output signal $V_{offset}-V_{tune}$ of the additional filter I(s) is used as input signal of the second voltage-controlled oscillator VCO-L. Thus, for example, an increase of the regulated voltage $V_{tune}$ leads to a frequency increase of the signal $f_H$ of the first oscillator VCO-H and at the same time to a frequency reduction of the signal $f_L$ of the second oscillator VCO-L. That way, a broadband frequency signal $f_{out}$ may be generated with a common control signal.

Thereby the circuit including both VCOs, I(s) and mixer performs e.g. like a single oscillator generating an output voltage $f_{out}$ from a control variable behind F(s). The signal $f_{out}$ divided down by the dividers /N and /K is compared with the reference frequency divided by the divider /R by the PLL 54 via the PFD, and the phase error via CP and F(s) is used to generate the control variable $V_{tune}$.

Further details and aspects are described in connection with examples detailed further above or further below. The examples shown using FIG. 5 may comprise one or more optional additional features corresponding to one or more aspects described in connection with the proposed concept or one or more examples further above or further below (for example in connection with FIGS. 1-4 and 6-8).

Figure 6:
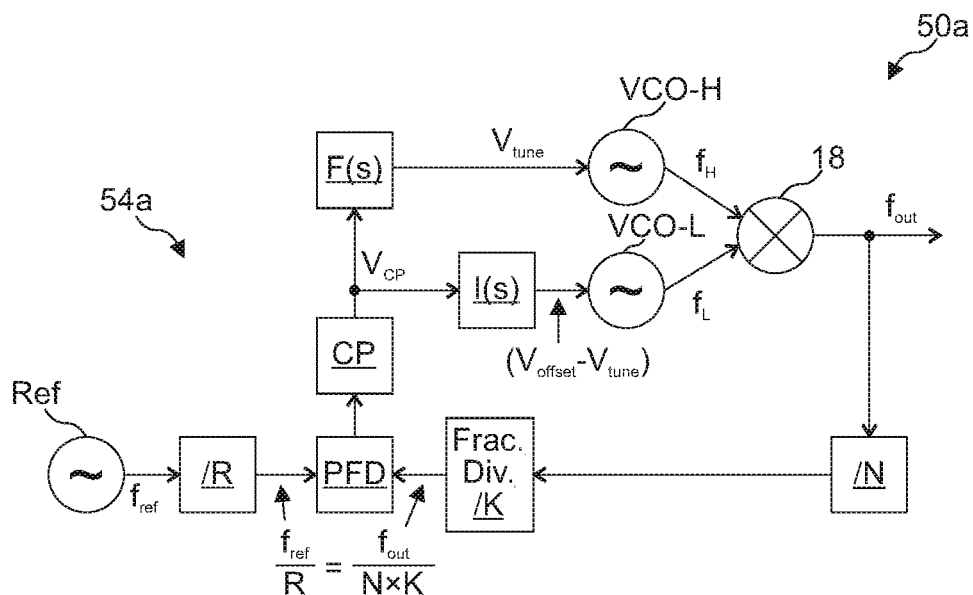
FIG. 6 shows a schematic illustration of a device with improved suppression of interference couplings.

FIG. 6 shows a schematic illustration of a device 50a with improved suppression of interference couplings. In contrast to the device 50 shown in FIG. 5, a phase-locked loop 54a of the device 50a comprises two separate loop filters F(s), I(s) which generate one control signal each for the oscillators from an output signal $V_{CP}$ of the charge pump CP. The signal $V_{tune}$ generated by the loop filter F(s) is used as input signal for the first oscillator VCO-H and the signal $V_{offset}-V_{tune}$ generated by the loop filter I(s) is used as input signal for the second oscillator VCO-L.

For example, signal lines of device 50a between the charge pump CP and the loop filters F(s), I(s) are kept very short in order to reduce the influence of interference couplings. The tune voltages behind the loop filters may be described as differential regulated signal pair, where interference couplings are reduced or eliminated by the mixing process of the the signals of the two VCOs.

Further details and aspects are described in connection with examples detailed further above or further below. The examples shown using FIG. 6 may comprise one or more optional additional features corresponding to one or more aspects described in connection with the proposed concept or one or more examples further above or further below (for example in connection with FIGS. 1-5 and 7-8).

Figure 7:
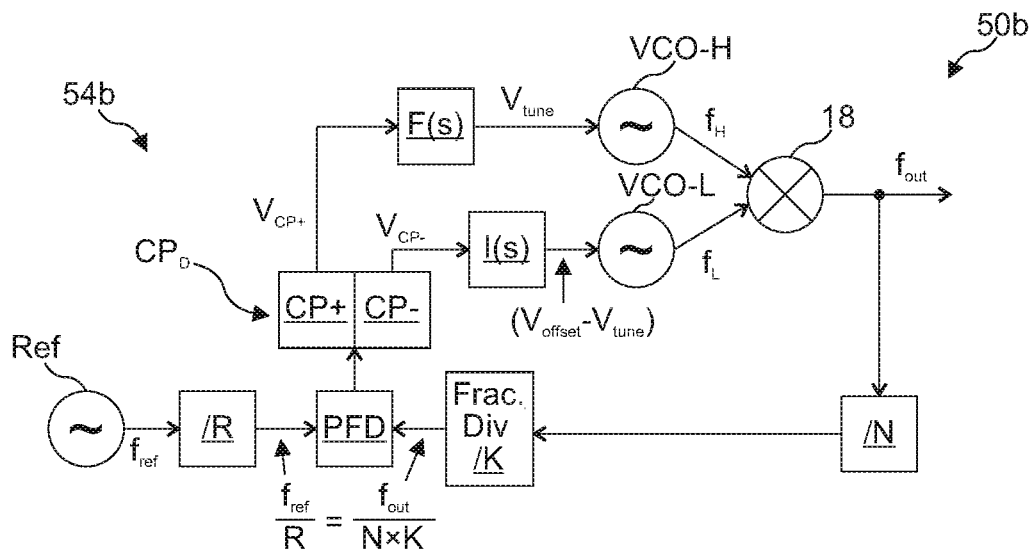
FIG. 7 shows a schematic illustration of a device with a differential charge pump device with improved suppression of interference couplings.

FIG. 7 shows a schematic illustration of a device 50b with a phase-locked loop 54b with a differential charge pump $CP_D$. The differential charge pump $CP_D$ is configured to generate differential output voltages. A first part CP+ of the differential charge pump $CP_D$ is configured to transmit a positive signal $V_{CP-}$ to the first loop filter F(s). A second part CP− of the differential charge pump $CP_D$ is configured to transmit a negative signal $V_{CP-}$ to the second loop filter I(s). This makes it possible to compensate more strongly for common mode interference couplings to the voltage signals $V_{CP+}$ and $V_{CP-}$ or $V_{tune}$ and $V_{offset}-V_{tune}$, using the mixing process in the mixer 18, due to the differential design of the device 50b.

Further details and aspects are described in connection with examples detailed further above or further below. The examples shown using FIG. 7 may comprise one or more optional additional features corresponding to one or more aspects described in connection with the proposed concept or one or more examples further above or further below (for example in connection with FIGS. 1-6 and 8).

Figure 8:
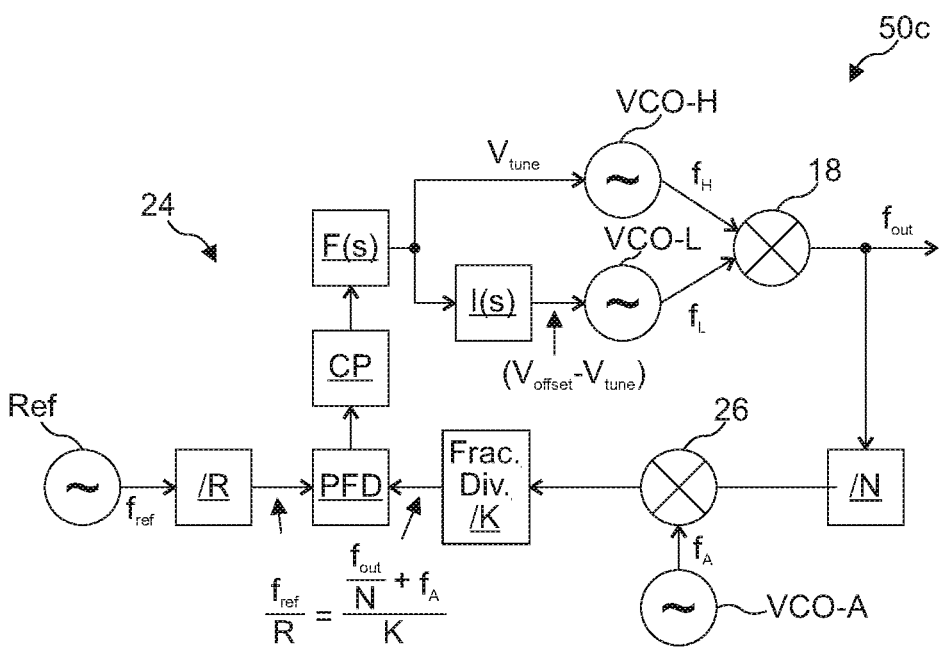
FIG. 8 shows a schematic illustration of a device with two controlled oscillators and a further controlled oscillator with a mixer in a feedback path of a common phase-locked loop of the two controlled oscillators.

FIG. 8 shows a schematic illustration of a device 50c with two controlled oscillators VCO-H, VCO-L and an additional voltage-controlled oscillator VCO-A as well as an additional mixer 26 in a feedback path of a common phase-locked loop 24 of the two controlled oscillators VCO-H, VCO-L.

The broadening via the voltage-controlled oscillator VCO-A as well as the additional mixer 26 in device 50c allows for the output signal $f_{out}$ divided by the divider /N to be mixed upward with a frequency $f_A$ of the additional oscillator VCO-A. This may enable a reduction of a variation in loop gain, for example in order to enable the PLL 24 to be capable of stabilizing the maximum bandwidth of $f_{out}$. As the divider /N is constant, the variation of the loop gain e.g. mainly depends on the transmission function of the oscillators VCO-H, VCO-L and on the adjustable divider /K. By upmixing the signal divided by divider /N with the frequency $f_A$ towards the upper frequency range, which the PLL 24 can process in normal operation at its input (before divider /K), the variation of the loop gain may be reduced via a smaller ratio of minimum value $K_{min}$ and maximum value $K_{max}$ of the divider /K.

For example, for a device without an additional oscillator VCO-A with $$\frac{f_{out}}{N} = 1 \ldots 3 \text{ GHz and } \frac{f_{ref}}{R} = 100 \text{ MHz}$$

for minimum and maximum values $K_{min}$, $K_{max}$ used at the adjustable divider, the following would apply:

$$K_{min} = \frac{1 \text{ GHz}}{100 \text{ MHz}} = 10; K_{max} = \frac{3 \text{ GHz}}{100 \text{ MHz}} = 30.$$

Thus a ratio of $K_{max}/K_{min}=3$ would be reached. In contrast, by means of the additional oscillator VCO-A the frequency of the output signal $f_{out}$ divided by the divider /N may be increased, for example by the frequency $f_A$ having a value of $f_A=5$ GHz. For $f_A=5$ GHz, $$\frac{f_{out}}{N} + f_A = 6 \ldots 8 \text{ GHz, and } \frac{f_{ref}}{R} = 100 \text{ MHz,}$$

follows $$K_{min} = \frac{6 \text{ GHz}}{100 \text{ MHz}} = 60, K_{max} = \frac{8 \text{ GHz}}{100 \text{ MHz}} = 80.$$

This results in an reduced ratio of $$\frac{K_{max}}{K_{min}} = 1, \overline{3}.$$

As the phase-locked loop operates in a smaller operating range of the partial ratios of the adjustable divider /K, an occurring variation of the loop gain may be reduced during operation.

For example, by using higher dividers /N, the ratio $$\frac{K_{max}}{K_{min}}$$

for the operation of the divider /K may be further reduced. For example, even without additional VCO-A, the variation of values of the divider /K may be reduced by higher dividers /N, however, some PLLs may require divider values of the divider /K>1. Thus, it can be advantageous to select the input frequencies of the PLL at the divider input/K at the upper edge of the input frequency range the PLL can use.

In addition, the concept with additional oscillator VCO-A and mixer 26 with a shift of the PLL control frequency to higher frequencies is also applicable to e.g. PLL realizations with a single VCO (e.g. in a phase-locked loop according to FIG. 4) and may enable the use of commercial or already existing PLL devices which, for example, have a minimum divider /K of unequal 1 (e.g. >30) which, e.g., cannot process arbitrarily small input frequencies. Due to this minimum divider /K, it is not possible for a PLL to regulate low frequencies $$\left(\text{e.g. } \frac{f_{out}}{N \times K} < \frac{f_{ref}}{R}\right),$$

which may be necessary with the concepts shown, since, for example, broadband output frequencies of the signal $f_{out}$ between 0 Hz up to several 10 GHz are to be generated.

The use of the additional mixer can be applied, as mentioned, not only to the signal generation principle with two VCOs shown in FIG. 8, but also to any signal generation circuits having a controlled oscillator and phase-locked loop (e.g. an oscillator with a phase-locked loop exclusively assigned to it).

Further details and aspects are described in connection with examples detailed further above or further below. The examples shown using FIG. 8 may comprise one or more optional additional features corresponding to one or more aspects described in connection with the proposed concept or one or more examples further above or further below (for example in connection with FIGS. 1-7).

One aspect of disclosure concerns a method for stabilizing two oscillators with a single phase-locked loop (PLL) to generate broadband signals.

By means of the proposed concepts, for example, broadband output signals can be created in a simple manner using two very high-frequency VCOs, whereby, e.g., only one PLL is required, so that the switching complexity and power loss may be reduced, compared to other concepts. For example, the robustness of the signal generation against interference couplings may be improved by the proposed differential tune voltages (e.g. control voltages of the controlled oscillators). Further, in-loop phase noise may be reduced by regulating a common phase-locked loop with $f_{out}$.

The aspects and features mentioned and described together with one or more of the previously detailed examples and figures may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, include equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, a network processor, an application specific integrated circuit (ASIC), a field programmable gate set (FPGA), read only memory (ROM) for storing software, random access memory (RAM), and non-volatile storage. Other hardware, conventional and/or custom, may also be included.

A block diagram may, for instance, illustrate a rough circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, —functions, —processes, —operations or —steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to also include features of a claim to any other independent claim even if this claim is not directly made dependent to the independent claim.

The invention claimed is:

1. A device for generating a broadband frequency signal, the device comprising:
    a first controlled oscillator;
    a second controlled oscillator;
    a phase-locked loop for feeding back a signal of the device based on an output signal of one of the controlled oscillators to both the first controlled oscillator and the second controlled oscillator; and a mixer, which is configured to generate the broadband frequency signal by mixing an output signal of the first controlled oscillator and an output signal of the second controlled oscillator,
wherein the first and second controlled oscillators are configured to cause a frequency change in the opposite direction upon a change of an input voltage; or
wherein the first and second controlled oscillators are configured to cause a frequency change in the same direction upon a change of an input voltage, and
a signal processing unit, which inverts a control signal of the oscillator, is arranged at the input of one of the two controlled oscillators.

2. The device of claim 1, further comprising
a reference signal source associated with both the first and second controlled oscillators.

3. The device of claim 1,
wherein the output of the mixer is coupled to the phase-locked loop for feeding back the broadband frequency signal both the first controlled oscillator and to the second controlled oscillator.

4. The device of claim 1, the phase-locked loop further comprising
a separate loop filter per controlled oscillator.

5. The device of claim 1,
wherein the phase-locked loop is configured to generate a differential tune voltage pair for the oscillators.

6. The device of claim 1, the phase-locked loop further comprising:
a differential charge pump, wherein a positive output of the differential charge pump is coupled to the first controlled oscillator and a negative output of the differential charge pump to the second controlled oscillator.

7. The device of claim 1, the phase-locked loop further comprising
an additional controlled oscillator and an additional mixer in the feedback path of the phase-locked loop, in order to increase a frequency of a feedback signal of the phase-locked loop by means of the additional controlled oscillator and the additional mixer.

8. The device of claim 1,
wherein an upper cut-off frequency of the first controlled oscillator is greater than or equal to a lower cut-off frequency of the second controlled oscillator.

9. The device of claim 1,
wherein an upper cut-off frequency of the first controlled oscillator is smaller than a lower cut-off frequency of the second controlled oscillator, wherein the frequency difference between the upper cut-off frequency of the first controlled oscillator and the lower cut-off frequency of the second controlled oscillator corresponds to a lower cut-off frequency of the broadband frequency signal.

10. The device of claim 1,
wherein a bandwidth of the generated frequency signal corresponds to the sum of respective bandwidths of the signals of the first controlled oscillator and the second controlled oscillator.

11. The device of claim 1,
wherein the frequency signal, which can be generated, comprises a bandwidth of at least 10 GHz.

12. The device of claim 1,
wherein the frequency signal, which can be generated, comprises a relative bandwidth of more than 20%.

13. The device of claim 1,
wherein a lower cut-off frequency of the output signals of the controlled oscillators is bigger than 1 GHz.

14. The device of claim 1,
wherein the frequency signal, which can be generated, is a ramp signal, a monofrequency signal and/or a signal with frequency shift keying or frequency hopping.

15. A high-frequency device for emitting a high-frequency signal, comprising a device according to claim 1.

16. A device for generating a frequency signal, the device comprising:
at least one first controlled oscillator; and
a phase-locked loop having a further controlled oscillator and an mixer in the feedback path of the phase-locked loop, in order to increase a frequency of a feedback signal of the phase-locked loop by means of the further controlled oscillator and the mixer.

17. The device of claim 16, further comprising:
a second controlled oscillator; and
a mixer, which is configured to generate the frequency signal by mixing an output signal of the first controlled oscillator and an output signal of the second controlled oscillator.

18. A method for generating a broadband frequency signal, the method comprising:
operating a first controlled oscillator and a second controlled oscillator using at least one phase-locked loop with an adjustable divider for both the first controlled oscillator and the second controlled oscillator,
wherein a ratio of a maximum divider value of the adjustable divider to a minimum divider value of the adjustable divider is less than 5; and
mixing the output signals of the two controlled oscillators to produce the broadband frequency signal.

19. The method of claim 18,
wherein a frequency ramp, a monofrequency signal and/or a signal with frequency shift keying or frequency hopping having a relative bandwidth of at least 20% is generated.

* * * * *